US009594193B2

(12) United States Patent
Guo et al.

(10) Patent No.: US 9,594,193 B2
(45) Date of Patent: Mar. 14, 2017

(54) PRINTING PLATE, SCATTERING LAYER, METHOD FOR FABRICATING THE SAME, AND DISPLAY APPARATUS

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Yuanhui Guo, Beijing (CN); Feng Qin, Beijing (CN); Hui Wang, Beijing (CN); Chun Wang, Beijing (CN); Yisan Zhang, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 413 days.

(21) Appl. No.: 14/347,123

(22) PCT Filed: Nov. 21, 2013

(86) PCT No.: PCT/CN2013/087583
§ 371 (c)(1),
(2) Date: Mar. 25, 2014

(87) PCT Pub. No.: WO2014/190689
PCT Pub. Date: Dec. 4, 2014

(65) Prior Publication Data
US 2016/0124128 A1 May 5, 2016

(30) Foreign Application Priority Data
May 30, 2013 (CN) .......................... 2013 1 0211181

(51) Int. Cl.
*G02B 5/02* (2006.01)
*B29C 33/42* (2006.01)
(Continued)

(52) U.S. Cl.
CPC .............. *G02B 5/021* (2013.01); *B29C 33/42* (2013.01); *G02B 5/0215* (2013.01);
(Continued)

(58) Field of Classification Search
CPC ....... G02B 5/02–5/0226; G02B 5/0268; G02B 5/0278; B29C 33/42; B29K 2025/06; B29K 2083/00; H01L 51/5268
(Continued)

(56) References Cited

U.S. PATENT DOCUMENTS

2005/0205863 A1* 9/2005 Choi ................... B82Y 10/00
257/40
2010/0123885 A1* 5/2010 Kobrin ................ G03B 27/42
355/53
(Continued)

FOREIGN PATENT DOCUMENTS

CN 202093197 U 12/2011
CN 103097953 A 5/2013
(Continued)

OTHER PUBLICATIONS

Written Opinion of the International Searching Authority Dated Jan. 22, 2014; Appln. No. PCT/CN2013/087583.
(Continued)

*Primary Examiner* — Derek S Chapel
(74) *Attorney, Agent, or Firm* — Ladas & Parry LLP

(57) ABSTRACT

A printing plate, a scattering layer and a method for fabricating the same, and a display apparatus are provided. The printing plate is formed with a plurality of protrusion structures thereon, and the protrusion structures have a maximum width of 1 nm-1000 nm. The scattering layer is obtained by printing using the printing plate, and has groove structures corresponding to the protrusion structures on the printing plate thereon. The scattering structure is used on an
(Continued)

organic light emitting display device, which can increase the light extraction efficiency and the external quantum efficiency and improve the display quality.

16 Claims, 4 Drawing Sheets

(51) Int. Cl.
  *H01L 51/52* (2006.01)
  *B29K 25/00* (2006.01)
  *B29K 83/00* (2006.01)

(52) U.S. Cl.
  CPC ......... *G02B 5/0268* (2013.01); *G02B 5/0278* (2013.01); *B29K 2025/06* (2013.01); *B29K 2083/00* (2013.01); *H01L 51/5268* (2013.01)

(58) Field of Classification Search
  USPC .......................................... 359/599; 349/112
  See application file for complete search history.

(56) References Cited

U.S. PATENT DOCUMENTS

| | | | |
|---|---|---|---|
| 2010/0134733 A1* | 6/2010 | Watanabe | G02B 5/0215 349/112 |
| 2012/0080710 A1* | 4/2012 | Inoue | G02B 5/045 257/98 |
| 2013/0224636 A1 | 8/2013 | Kobrin | |

FOREIGN PATENT DOCUMENTS

| | | |
|---|---|---|
| CN | 103332031 A | 10/2013 |
| CN | 203282812 A | 11/2013 |
| JP | 2010115804 A | 5/2010 |

OTHER PUBLICATIONS

First Chinese Office Action dated Feb. 4, 2015; Appln. No. 201310211181.8.
International Search Report maield Feb. 20, 2014: PCT/CN2013/087583.

* cited by examiner

PRINTING PLATE, SCATTERING LAYER, METHOD FOR FABRICATING THE SAME, AND DISPLAY APPARATUS

FIELD OF THE INVENTION

Embodiments of the present invention relate to a printing plate, a scattering layer, a method for fabricating the same, and a display apparatus.

BACKGROUND OF THE INVENTION

Organic Light Emitting Diode (OLED) display screen is considered as the next generation of flat panel display due to its advantages of self emission, being free of backlight, high contrast, small thickness, wide view angle, fast response, being suitable for flexible panel, wide operating temperature range, simple configuration and manufacturing processes, etc.

OLED display device comprises an emission unit disposed on a substrate, which comprises two electrodes and an organic electroluminescent material layer interposed therebetween. In the prior art, a transparent glass is generally used as the substrate. A refractive index of the glass is generally 1.4-1.5 and a refractive index of the organic electroluminescent material layer is 1.7-1.8. Upon a light emitted from the electroluminescent material transmitting through the glass and enters into air, most of the light is confined to the organic electroluminescent material layer due to a total reflection. Only 20% of the photons can be emitted from the OLED device, so the external quantum efficiency of the device is just up to 17%. The low light extraction efficiency and external quantum efficiency may result in the following problems of the device: low optical efficiency, high power consumption, high temperature of chip, short lift time, and so on.

In the prior art, there are various technologies for improving the light extraction efficiency of the OLED display screen, comprising micro lens technology, photon crystal technology, nanowire technology, scattering layer technology, microcavity resonance technology, and so on. The scattering layer technology has advantageous of low cost, less spectral shift, better improving the external quantum efficiency, so it attracts many attentions. In the scattering layer technology, one scattering layer is disposed on the substrate of the OLED display screen to increase the external quantum efficiency. The current scattering layer is a thin film embedded with scattering particles therein, in which the scattering particles may not be distributed uniformly and be overlapped with each other to form multiple layers in the thin film due to a limitation of the manufacturing processes. As a result, the wavelength and strength of the light emitted from the OLED device may be changed as the view angle of the users is changed, that is, the OLED device has a serious color shift, so that the display quality is poor.

SUMMARY OF THE INVENTION

Embodiments of the present invention provide a printing plate, a scattering layer and a method for fabricating the same, and a display apparatus. The printing plate is used for preparing the scattering layer. Groove structures are arranged uniformly on the scattering layer, so that the light extraction efficiency and the external quantum efficiency are increased and the display quality is improved.

The embodiments of the present invention provide a printing plate formed with a plurality of protrusion structures thereon, wherein, the protrusion structures have a maximum width of 1 nm-1000 nm.

For example, the printing plate is used for preparing a scattering layer.

For example, the protrusion structures are uniformly arranged on the printing plate in a matrix form.

For example, the protrusion structures are in a hemisphere shape.

For example, a diameter of the hemisphere is in a range of 1 nm-1000 nm.

For example, the printing plate is made of a material having curable shaping property.

For example, the printing plate is made of methyl siloxane.

The embodiments of the present invention provide a method for fabricating the printing plate, which comprises:

preparing groove structures with a maximum width of 1 nm-1000 nm on a first substrate;

forming a film made of a material having curable shaping property on a surface of the first substrate provided with the groove structures;

performing a curing process on the film made of the material having curable shaping property; and peeling off the cured film to form protrusion structures on a surface of the film made of the material having curable shaping property, the protrusion structures having a maximum width of 1 nm-1000 nm.

For example, the material having curable shaping property is methyl siloxane.

For example, the step of performing a curing process on the film made of the material having curable shaping property comprises performing a light curing process on the film of methyl siloxane.

For example, the step of preparing groove structures with a maximum width of 1 nm-1000 nm on a first substrate comprises:

forming a monolayer of nanoparticles having shrinkable property on the first substrate;

after uniformly distributing the nanoparticles on the first substrate, performing a shrink treatment on the nanoparticles;

forming a thin film on a surface of the first substrate, a thickness of the thin film being no more than a diameter of the nanoparticles; and removing the nanoparticles embedded in the thin film.

For example, the nanoparticles having shrinkable property are polystyrene nanoparticles.

For example, the step of forming a monolayer of nanoparticles having shrinkable property on the first substrate comprises:

forming a mixture of the polystyrene nanoparticles, methanol, and dispersant; and spin-coating the mixture on the first substrate.

For example, the step of performing a shrink treatment on the nanoparticles comprises performing a plasma treatment on the polystyrene nanoparticles.

For example, the step of removing the nanoparticles embedded in the thin film comprises:

removing the polystyrene nanoparticles embedded in the thin film by using ultrasonic wave in a liquid.

For example, a diameter of the polystyrene nanoparticles is in a range of 1 nm-1000 nm.

For example, the first substrate is a silicon wafer or a metal substrate.

For example, the thin film formed on the first substrate is made of a material the same as that of the first substrate.

The embodiments of the present invention provide a scattering layer formed with a plurality of groove structures thereon, wherein, the groove structures have a maximum width of 1 nm-1000 nm, and are printed by any one of the printing plates provided in the embodiments of the present invention.

For example, the groove structures are arranged on the scattering layer in a matrix form.

For example, the groove structures are in a hemisphere shape.

For example, a diameter of the hemisphere is in a range of 1 nm-1000 nm.

For example, the scattering layer is made of a material having curable shaping property.

For example, the scattering layer is made of a material of curable adhesive.

The embodiments of the present invention provide a method for fabricating a scattering layer, which comprises:

preparing a printing plate;

forming a film made of a material having curable shaping property;

printing the film made of the material having curable shaping property by using the printing plate, to form the groove structures with a maximum width of 1 nm-1000 nm on the film;

performing a curing process on the film made of the material having curable shaping property.

For example, the material having curable shaping property is curable adhesive.

For example, the step of performing a curing process on the film made of the material having curable shaping property comprises performing a UV light curing process on the curable adhesive.

For example, a thickness of the film made of the material having curable shaping property is no more than a diameter of the protrusion structures on the printing plate.

For example, the step of printing the film made of the material having curable shaping property by using the printing plate, to form the groove structures with a maximum width of 1 nm-1000 nm on the film, comprises:

disposing the surface of the printing plate provided with the protrusion structures and the film made of the curable shaping material opposed to each other and laminating them; and peeling off the printing plate, to form the groove structures on the film made of the material having curable shaping property corresponding to the protrusion structures of the printing plate.

The embodiments of the present invention provide a display apparatus, which comprises a substrate and a scattering layer disposed on the substrate, wherein, the scattering layer is the scattering layer provided in the embodiments of the present invention.

For example, the scattering layer is disposed on a light exiting surface of the substrate.

The embodiments of the present invention provide a printing plate, a scattering layer and a method for fabricating the same, and a display apparatus. A plurality of groove structures are formed on the printing plate and have a maximum width of 1 nm-1000 nm. The protrusion structures of the printing plate have high fineness. The scattering layer is printed by the printing plate. Groove structures are formed on the scattering layer to correspond to the protrusion structures of the printing plate, and are uniformly arranged with uniform size. The scattering layer can be applied on the OLED display apparatus, to increase the light extraction efficiency and the external quantum efficiency and improve the display quality.

REFERENCE NUMBERS

10—protrusion structure; 11—transparent substrate; 12—anode electrode layer; 13—emission layer; 14—cathode electrode layer; 20—groove structure; 30—first substrate; 31—polystyrene nanoparticles; 32—thin film; 33—methly siloxane layer; 34—printing plate; 40—display screen; 41—curable adhesive; 42—scattering layer.

DETAILED DESCRIPTION OF THE PREFERRED EMBODIMENTS

Technical solutions in the embodiments of the present invention are described clearly and completely in connection with the drawings. Apparently, only some embodiments of the present invention, but not all embodiments, are set forth here.

Figure 1:
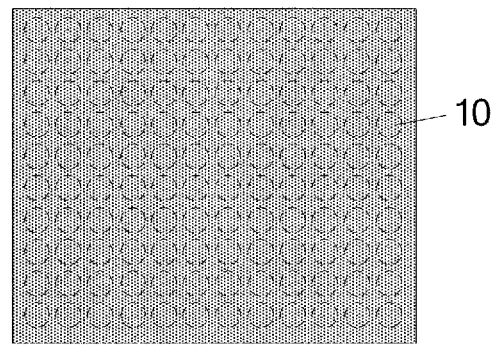
FIG. 1 is a schematic structure top-view of a printing plate provided in an embodiment of the present invention.
Figure 2:
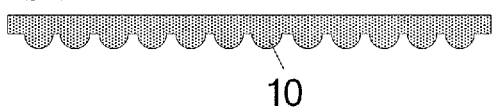
FIG. 2 is a schematic structure side-view of the printing plate illustrated in FIG. 1.

An embodiment of the present invention provides a printing plate 34, as illustrated in FIGS. 1 and 2. The printing plate 34 is formed with a plurality of protrusion structures 10, and the maximum width of each protrusion structure is in a range of 1 nm-1000 nm.

It should be noted that: the printing plate is used as a mold for forming a pattern corresponding to the pattern of the printing plate. According to the use of the printing plate and the method for forming the printing plate, various patterns can be formed on the printing plate, for example, the protrusion structure may be in spherical shape, and also may be in cube shape, or in other shapes. The maximum width of the protrusion structure is the maximum distance between two points on a plane of the protrusion structure. For example, if the protrusion structure is in spherical shape, the maximum width of the protrusion structure is a diameter of the ball; if the protrusion structure is in cube shape, the maximum width of the protrusion structure is an edge length of the cube; if the protrusion structure is in irregular shape, the maximum width of the protrusion structure is the maximum distance between two points on a plane of the irregular shape. In embodiments of the present invention, the protrusion structures provided on the printing plate mainly serve to fabricate a scattering layer.

Embodiments of the present invention provide a printing plate formed with a plurality of protrusion structures thereon. Groove structures corresponding to the protrusion structures can be obtained by printing using the printing plate. The maximum width of the protrusion structures on the printing plate is in a range of 1 nm-1000 nm. The protrusion structures are formed finely, so that it can be used to fabricate the scattering layer of the organic light emitting display device. Compared with a conventional method for fabricating the scattering layer, fabricating the scattering layer by using the printing plate not only may ensure the fineness of the pattern of the scattering layer, but also may simplify the processes and improve the production efficiency. The groove structures formed on the scattering layer is uniform, which contributes to increase the light extraction efficiency and the external quantum efficiency, and improve the display quality.

For example, as illustrated in FIGS. 1 and 2, the protrusion structures are arranged uniformly on the printing plate 34 in a matrix form. It should be noted that: uniformly arranging the protrusion structures not only indicates to the uniform arrangement of the protrusion structures, but also indicates the uniform size of the protrusion structures.

For example, as illustrated in FIGS. 1 and 2, the protrusion structures are in hemispherical shape. When the protrusion structures are in hemispherical shape, hemispheres corresponding to the protrusion structures can be formed after printing by using the printing plate. The protrusion structures also can be in other shapes, so that the corresponding shapes can be formed after printing by using the printing plate.

For example, the diameter of the hemisphere is in a range of 1 nm-1000 nm. It should be noted that: the diameter of the hemisphere being in a range of 1 nm-1000 nm, indicates that the protrusion structures of the printing plate have a uniform size that is in a range of 1 nm-1000 nm. However, because of the limitation of the production processes, there must be manufacturing tolerances. In the embodiments of the present invention, the manufacturing tolerances of the hemispherical protrusion structures on the printing plate may be, for example, equal to or less than 100 nm, which can ensure the fineness of the printing patterns.

For example, the printing plate may be made of a material with curable shaping property. For example, the material of the printing plate may be methyl siloxane. The printing plate also can be formed of other materials, for example, UV curable shaping material, such as, polyurethane resin or the like. The embodiment of the present invention is described with an example of using methyl siloxane as the material of the printing plate.

Embodiments of the present invention provide a method for fabricating a printing plate, comprises:

Step S101, forming groove structures with a maximum width of 1 nm-1000 nm on a first substrate.

For example, the step S101 comprises:

Step S1011, forming a monolayer of nanoparticles having shrinkable property on the first substrate.

Figure 5:
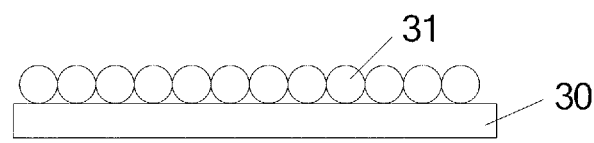
FIG. 5 is a schematic structure side-view of a nano particle monolayer formed on a first substrate.
Figure 6:
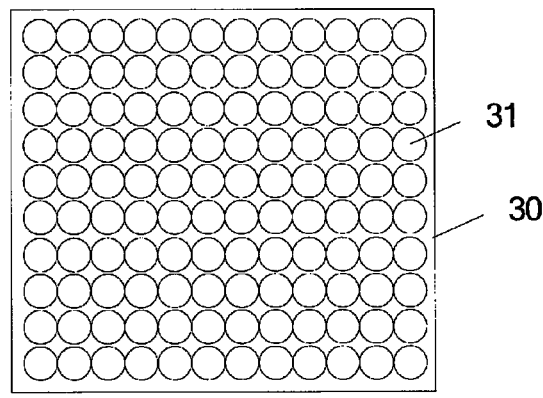
FIG.6 is a schematic structure top-view of the nano particle monolayer formed on the first substrate illustrated in FIG.5.

In particular, the nanoparticles having shrinkable property may be polystyrene nanoparticles. The material having shrinkable property can also be other nanoparticles, for example, may be copper oxide nanoparticles, since the copper oxide may expand and shrink with change of the temperature, and the diameter of the copper oxide nanoparticles is in a range of 1-100 nm. Herein, polystyrene is described as an example to illustrate the embodiment of the invention. As illustrated in FIGS. 5 and 6, a monolayer having polystyrene nanoparticles 31 is formed on the first substrate 30. The diameter of the polystyrene nanoparticles is in a range of 1 nm-1000 nm. The first substrate may be a glass substrate, a metal substrate, a silicon wafer or a silicon dioxide substrate. For example, the first substrate may be a silicon wafer or a metal substrate.

The step S1011, i.e., forming a monolayer of nanoparticles having shrinkable property on the first substrate, comprises:

Step S10111, forming a mixture of polystyrene nanoparticles, methanol, and dispersant.

Wherein, methanol is a solvent, has low melting point, and is easy to volatile; the dispersant contributes to the arrangement of the polystyrene nanoparticles on the surface of the substrate, prevents the accumulation of the molecules so as to form the monolayer.

Step S10112, spin-coating the above mixture on the first substrate.

Spin-coating the above mixture on the first substrate may ensure a uniform layer formed between the mixture and the first substrate, that is, a monolayer of polystyrene nanoparticles, so that the polystyrene nanoparticles are distributed uniformly on the first substrate in a matrix form. As illustrated in FIGS. 5 and 6, the monolayer of the polystyrene nanoparticles 31 is formed on the first substrate 30.

Step S1012, after uniformly distributing the above nanoparticles on the first substrate, performing a shrink treatment on the above nanoparticles.

Figure 7:
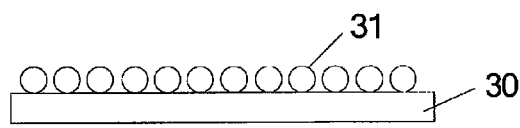
FIG. 7 is a schematic structure side-view after the nano particles are treated and shrinked.
Figure 8:
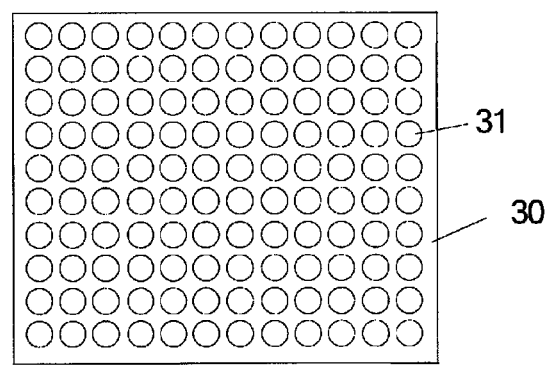
FIG. 8 is a schematic structure top-view after the nano particles are treated and shrinked.

It should be noted that: the conditions for shrinking the particles are various based on different materials. For example, copper oxide nanoparticles may expand and shrink as the temperature is changed. In the embodiment of the present invention, the polystyrene nanoparticles are described as an example. In detail, a plasma treatment may be applied to the polystyrene nanoparticles, so that the diameter of the polystyrene nanoparticles is reduced, while the adhesion between the polystyrene nanoparticles and the surface of the first substrate may be enhanced. As illustrated in FIGS. 7 and 8, after the plasma treatment, the polystyrene nanoparticles 31 shrink, and the diameter thereof is reduced, so a gap is formed between two adjacent nanoparticles which were in contact with each other before the treatment.

Step S1013, forming a thin film on the surface of the first substrate, the thickness of the thin film is no more than the diameter of the nanoparticles.

Figure 9:
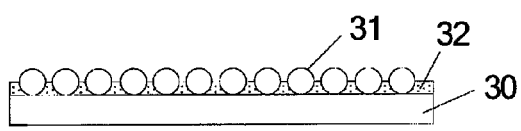
FIG. 9 is a schematic structure side-view of one thin film formed on a surface of the first substrate.
Figure 10:
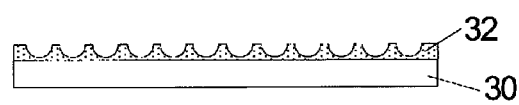
FIG. 10 is a schematic structure view of removing the nano particles from the thin film illustrated in FIG. 9.

It should be noted that: after the shrinking of the nanoparticles, a gap is formed between two adjacent nanoparticles, and then a thin film is formed on the nanoparticles, so that the nanoparticles are embedded in the thin film. As illustrated in FIG. 9, after the plasma treatment, a gap is presented between adjacent polystyrene nanoparticles 31, then a thin film 32 is formed on the first substrate 30, and thus the polystyrene nanoparticles 31 are embedded in the thin film 32. For example, the thin film formed on the first substrate is made of a material the same as that of the first substrate. For example, the first substrate may be a silicon wafer, the thin film may be made of silicon oxide, so that there is a good adhesion between the thin film and the first substrate, and the thin film may not be peeled off from the first substrate during the rest of the processes for preparing the printing plate. Also, the substrate and the thin film may be made of other materials having the same property. For example, the first substrate is a metal substrate, and the thin film may be made of metal oxides or the like. The thickness of the thin film is no more than the diameter of the nanoparticles, which favors to removing the embedded nanoparticles later. Specifically, the first substrate can be placed into a vacuum box, and a thin film can be formed on the surface of the first substrate by an evaporation or deposition method.

Step S1014, removing the nanoparticles embedded in the thin film.

The polystyrene nanoparticles embedded in the thin film 32 are removed, so groove structures are formed at locations corresponding to the polystyrene nanoparticles on the thin film 32. In particular, removing the nanoparticles embedded in the thin film comprises: in a liquid, the polystyrene nanoparticles are removed by using ultrasonic wave. The ultrasonic wave propagates in a liquid well. Thus, the first substrate is immersed in a mixed solution of ethanol and/or isopropanol, and then the polystyrene nanoparticles are removed by using ultrasonic wave. Since the nanoparticles are embedded in the thin film, a plurality of groove structures is formed on the thin film by removing the nanoparticles.

It should be noted that: forming the groove structures on the substrate can also be implemented in other ways, while the above method is described in the embodiments of the present invention as an example.

Step S102, forming a film made of a material having curable shaping property on the surface of the first substrate provided with the groove structures.

Figure 11:
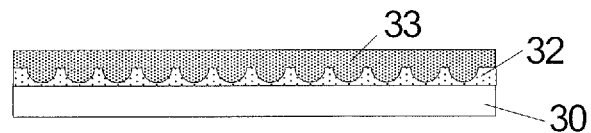
FIG. 11 is a schematic view of forming a layer of methly siloxane on the surface of the first substrate provided with a groove structure.

In particular, the material having curable shaping property may be methyl siloxane. As illustrated in FIG. 11, a film 33 of methyl siloxane is formed on the surface of the first substrate prepared with the groove structures, so that the groove structures are filled with methyl siloxane. Also, the material having curable shaping property may be other materials, e.g., may be polyurethane resin, or the like. Methyl siloxane has low price, is easy to use, and has good chemical inertness, so the methyl siloxane is described in the embodiments of the present invention as an example. The film of methyl siloxane is formed on the substrate provide with the groove structures by using a pouring method, which may ensure that no air bubbles are faulted between the first substrate and the film of methyl siloxane. The air bubbles on the printing plate may result in the air bubbles on the product printed by the printing plate, the uniformity of the groove structures are poor, and there is possibility that the groove structures may not be formed due to the air bubbles.

Step S103, performing a curing process on the film of the material having curable shaping property.

Performing a curing process on the film of the material having curable shaping property may be performed by a light curing process on the film of methyl siloxane. Also, other treatments such as a heat curing can be performed on the film of methyl siloxane. Performing the light curing process on the methyl siloxane is described in the embodiments of the present invention as an example. After the methyl siloxane is crosslinked, the crosslinked methyl siloxane is easily peeled off in the next step, and is not easily deformed.

Step S104, peeling off the cured film to form protrusion structures on the surface of the cured film having curable shaping property, the maximum width of the protrusion structures is in a range of 1 nm-1000 nm.

Figure 12:
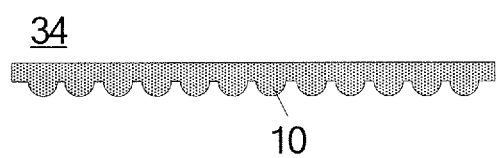
FIG. 12 is a schematic view of the layer of methly siloxane illustrated in FIG. 11 after beeing cured and peeled off.

As illustrated in FIG. 12, since methyl siloxane is coated on the substrate with the groove structures, the protrusion structures 10 having the maximum width of 1 nm-1000 nm are formed at locations corresponding to the groove structures on the substrate. After peeling off the methyl siloxane, the printing plate 34 is formed. The embodiments of the present invention provide a scattering layer 42, as illustrated in FIGS. 3 and 4, a plurality of groove structures 20 having the maximum width of 1 nm-1000 nm are formed on the scattering layer 42, which is fabricated by using the printing plate provided in the embodiments of the present invention.

Embodiments of the present invention provide a scattering layer having a plurality of groove structures thereon. The groove structures have high fineness, and the maximum width thereof is in a range of 1 nm-1000 nm. The scattering layer can be employed in OLED display screen, and the groove structures can reduce the total reflection, damage the microcavity effect of OLED, and increase the optical efficiency of the OLED. In addition, the grooves structures on the scattering layer are uniformly distributed in a matrix form, so that the wavelength and strength of the emitted light of OLED are prevented from being changed as the view angle of the user is changed, the color shift is reduced, and the display quality is improved. Compared with the conventional method of forming the scattering layer, such as, coating method, or the like, the method according to the embodiment of the invention, i.e., printing the scattering layer by using the printing plate, can simplify the fabrication processes and increase the production efficiency. In addition, the printing plate can be reused to save the cost, and can also be used for obtaining a large size scattering layer.

Figure 3:
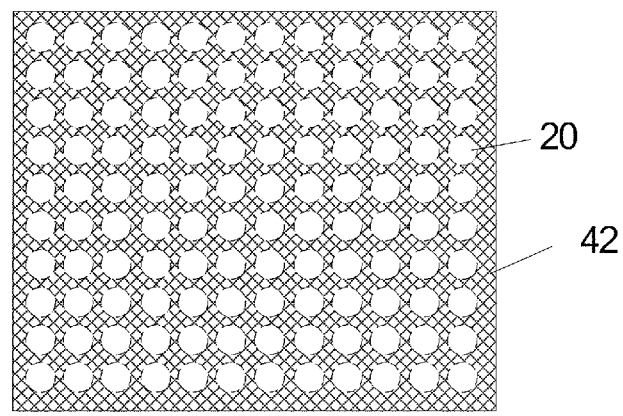
FIG. 3 is a schematic structure top-view of a scattering layer provided in an embodiment of the present invention.
Figure 4:
FIG. 4 is a schematic structure side-view of the scattering layer illustrated in FIG. 3.

For example, as illustrated in FIG. 3, the groove structures 20 are uniformly distributed on the scattering layer 42 in a matrix form.

For example, in FIG. 3, the groove structures are in hemisphere shape. It should be noted that the shape of the groove structures corresponds to the shape of the protrusion structures on the printing plate, since the groove structures are printed by using the printing plate. Upon the protrusion structures of the printing plate being in hemisphere shape, the groove structures of the scattering layer printed by the printing plate are also in hemisphere shape.

The diameter of the hemisphere may be in a range of 1 nm-1000 nm. The diameter of the hemisphere can be affected by the diameter of the protrusion structures on the printing plate and the thickness of the scattering layer. For example, if the diameter of the hemispherical protrusion structures on the printing plate is 300 nm and the thickness of the scattering layer is less than the diameter of the hemispherical protrusion structures, the diameter of the protrusion structures is slightly small than 300 nm. Since the distribution and the size of the hemispherical protrusion structures are uniform, the distribution and the size of hemispherical groove structures formed by the printing plate are also uniform, so that the display quality can be improved. The groove structures on the scattering layer have high fineness, and the diameter thereof is in a range of 1 nm-1000 nm, which favors to increase the light extraction efficiency.

For example, the scattering layer may be made of a material having curable shaping property. For example, the scattering layer may be made of a transparent material having curable shaping property, which can reduce the loss of the light transmitted through the scattering layer. The scattering layer can also be opaque. The material having curable shaping property may be, for example, transparent, curable polymer material, or the like. The scattering layer may be faulted of a curable adhesive, which is transparent, and has good adhesive property, and may ensure being not easily peeled off after being formed on the substrate. The scattering layer made of the curable adhesive is described in the embodiments of the present invention as an example.

Embodiments of the present invention provide a method for fabricating a scattering layer, comprising:

Step S201, preparing the printing plate.

In particular, a plurality of protrusion structures are formed on the printing plate, and have the maximum width of 1 nm-1000 nm. Further, the protrusion structures are in hemisphere shape, and the diameter thereof is in a range of 1 nm-1000 nm. The protrusion structures are uniformly distributed in a matrix form on the printing plate, and the printing plate can be prepared by the above described steps S101-S104.

The printing plate can also be prepared by other methods. The embodiments of the present invention do not limit the method for preparing the printing plate.

Step S202, forming a film made of a material having curable shaping property on a second substrate.

Figure 13:
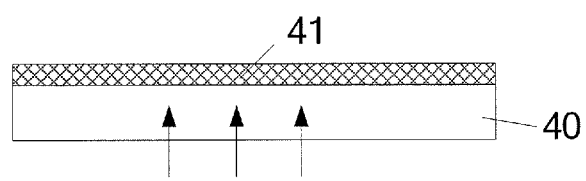
FIG. 13 is a schematic view of forming a curable adhesive layer on a display screen.
Figure 15:
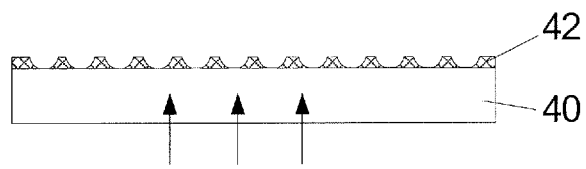
FIG. 15 is a schematic view of a scattering layer of the curable adhesive formed by peeling off the printing plate.

It should be noted that: the second substrate may be a substrate having no film thereon, and may also be a substrate having other films thereon. In this time, the film made of the material having curable shaping property is formed on the second substrate, that is, the film made of the material having curable shaping property is formed on the other films of the second substrate. The second substrate can also be other flat plate, for example, may be display screen, or the like. In this case, the film made of the material having curable shaping property is formed on the light exiting surface of the display screen. The film of the curable shaping material on the second substrate is processed in the sequence processes to form a scattering layer. By taking the OLED display screen as an example, the scattering layer may be formed on a side of the cathode or the anode away from emission material, and may also be directly formed on the light exiting surface of the OLED display screen. The material having curable shaping property may be curable adhesive. As illustrated in FIG. 13, the curable adhesive 41 is formed on the light exiting surface of the OLED display screen 40. The thickness of the film made of the curable shaping material is no more than the diameter of the protrusion structures on the printing plate. Since the thickness of the formed film is small than the diameter of the protrusion structures on the printing plate, after the printing by the printing plate, as illustrated in FIG. 15, the groove structures formed on the film directly contact the second substrate, and thus the brightness of the display is large. Also, the thickness of the curable adhesive may be larger than the diameter of the protrusion structures on the printing plate, so the curable adhesive may be disposed between the groove structures of the scattering layer and the second substrate, such that the adhesion between the scattering layer and the second substrate is good and they are not easily separated from each other.

Step S203, printing the film made of the material having curable shaping property by using the above printing plate to form the groove structures having the maximum width of 1 nm-1000 nm on the surface of the film.

In particular, the step S203 comprises:

Step S2031, disposing the surface of the printing plate provided with the protrusion structures and the film made of the curable shaping material opposed to each other and laminating them.

Figure 14:
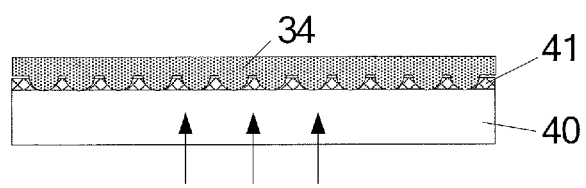
FIG. 14 is a schematic view of printing on curable adhesive using the printing plate.

As illustrated in FIG. 14, the surface of the printing plate 34 provided with the protrusion structures is opposed to the curable adhesive 41, and then the printing plate is laminated on the curable adhesive 41.

Step S2032, peeling off the printing plate, to faun the groove structures on the film made of the curable shaping material corresponding to the protrusion structures of the printing plate.

As illustrated in FIG. 15, after the printing plate 34 is peeled off, a plurality of groove structures are formed on the curable adhesive.

Step S204, performing a curing process on the film made of the curable shaping material.

In particular, the film is made of curable adhesive, and a UV light curing process is performed on the curable adhesive. Other curing processes, such as, heat curing, or the like, can also be performed on the curable adhesive. After performing the curing process, the groove structures formed on the curable adhesive may not deformed, as illustrated in FIG. 15. The cured adhesive is the scattering layer 42.

Embodiments of the present invention provide a display device comprising a substrate and a scattering layer disposed on the substrate, wherein the scattering layer is any one of the scattering layers provided in the embodiments of the present invention.

Figure 16:
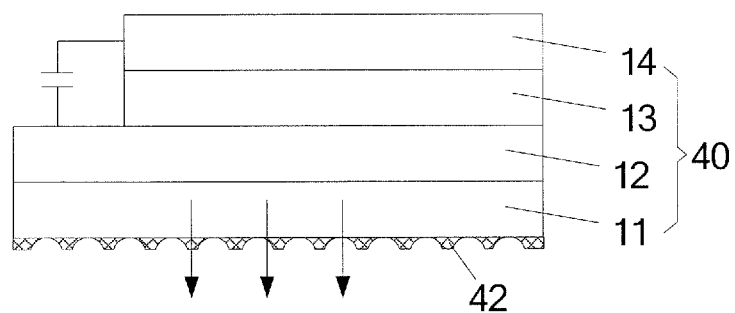
FIG. 16 is a schematic view of a display device provided in an embodiment of the present invention.

It should be noted that: OLED display device can be classified as bottom emitting OLED display device and top emitting OLED display device according to the direction of the emitted light. In particular, as illustrated in FIG. 16, an OLED display device comprises a transparent substrate 11, and an anode layer 12, an emission layer 13, and a reflective cathode layer 14 sequentially disposed on the transparent substrate 11. If the light is emitted from the side of the transparent substrate 11, it is the bottom emitting OLED display device; if the light is emitted from the reflective cathode side, it is the top emitting OLED display device. The display device provided in the embodiments of the present invention can be any one of the described display devices.

Since the display device has the scattering layer thereon in the embodiments of the present invention, the total reflection between the light emitting surface of the OLED and the air is decreased, the microcavity effect is reduced, and the external quantum efficiency of the OLED is increased. The display apparatus may be display devices such as, OLED display panel, OLED display, or the like, and any product or component with displaying function and including the display devices, such as, TV, digital camera, cell phone, tablet PC, etc.

For example, the display apparatus is a bottom emitting OLED. As illustrated in FIG. 16 , the bottom emitting OLED comprises a transparent substrate 11, and an anode layer 12, an emission layer 13, and a reflective cathode layer 14 sequentially disposed on the transparent substrate 11. The scattering layer may be disposed on any one of the two sides of the transparent substrate 11. For example, the scattering layer may be disposed on a side of the transparent substrate provided with the anode layer, or be disposed on a side of the transparent substrate without the anode layer, i.e., a light exiting side of the transparent substrate. As illustrated in FIG. 15, the scattering layer 42 is disposed on the light exiting surface of the transparent substrate 11. Upon the scattering layer being disposed on the light exiting surface of the transparent substrate, a scattering layer can be further formed on the finished display screen, so the production process is simple.

The above embodiments are merely exemplary embodiments used to explain the principles of the present invention; however, the present invention is not limited thereto. Those with ordinary skills in the art may make various modifications and changes without departing the spirit and essential of the present invention, and these modifications and changes should be regarded within the protection scope of the present invention. Thus, the protection scope of the invention should be defined by the appended claims.

What is claimed is:

1. A method for fabricating a printing plate comprising:
    forming a monolayer of nanoparticles having shrinkable property on a first substrate and processing the nanoparticles to prepare groove structures with a maximum width of 1 nm-1000 nm on the first substrate;
    forming a film made of a material having curable shaping property on a surface of the first substrate provided with the groove structures;
    performing a curing process on the film made of the material having curable shaping property; and
    peeling off the cured film to form protrusion structures on a surface of the film made of the material having curable shaping property, the protrusion structures having a maximum width of 1 nm-1000 nm.

2. The method according to claim 1, wherein, the material having curable shaping property is methyl siloxane.

3. The method according to claim 2, wherein, performing a curing process on the film made of the material having the curable shaping property comprises performing a light curing process on the film of methyl siloxane.

4. The method according to claim 1, wherein, processing the nanoparticles to prepare groove structures with a maximum width of 1 nm-1000 nm on the first substrate comprises:
    after uniformly distributing the nanoparticles on the first substrate, performing a shrink treatment on the nanoparticles;
    forming a thin film on a surface of the first substrate, a thickness of the thin film being no more than a diameter of the nanoparticles; and
    removing the nanoparticles embedded in the thin film.

5. The method according to claim 4, wherein, the nanoparticles having shrinkable property are polystyrene nanoparticles.

6. The method according to claim 5, wherein, forming a monolayer of nanoparticles having shrinkable property on the first substrate comprises:
    forming a mixture of the polystyrene nanoparticles, methanol, and dispersant; and
    spin-coating the mixture on the first substrate.

7. The method according to claim 5, wherein, performing a shrink treatment on the nanoparticles comprises performing a plasma treatment on the polystyrene nanoparticles.

8. The method according to claim 5, wherein, removing the nanoparticles embedded in the thin film comprises:
    removing the polystyrene nanoparticles embedded in the thin film by using ultrasonic wave in a liquid.

9. The method according to claim 5, wherein, a diameter of the polystyrene nanoparticles is in a range of 1 nm-1000nm.

10. The method according to claim 4, wherein, the thin film formed on the first substrate is made of a material the same as that of the first substrate.

11. A scattering layer formed with a plurality of groove structures thereon, wherein, the groove structures have a maximum width of 1 nm-1000 nm, and are printed by the printing plate formed with a plurality of protrusion structures thereon, wherein, the protrusion structures have a maximum width of 1 nm-1000 nm and are formed by the method of claim 1.

12. The scattering layer according to claim 11, wherein, the groove structures are arranged on the scattering layer in a matrix form.

13. The scattering layer according to claim 11, wherein, the groove structures are in a hemisphere shape.

14. The scattering layer according to claim 11, wherein, the scattering layer is made of a material having curable shaping property.

15. A display apparatus comprises a substrate and a scattering layer disposed on the substrate, wherein, the scattering layer is the scattering layer of claim 11.

16. The display apparatus according to claim 15, wherein, the scattering layer is disposed on a light exiting surface of the substrate.

* * * * *